United States Patent [19]

Suzuki et al.

[11] Patent Number: 4,691,287

[45] Date of Patent: Sep. 1, 1987

[54] IC DEVICE AND A SYSTEM FOR TESTING THE SAME

[75] Inventors: Soichi Suzuki, Yokohama; Mitsuo Aihara, Kamakura; Mitsuo Fujii, Kawasaki, all of Japan

[73] Assignee: Kabushiki Kaisha Toshiba, Kawasaki, Japan

[21] Appl. No.: 664,764

[22] Filed: Oct. 25, 1984

[30] Foreign Application Priority Data

Oct. 31, 1983 [JP] Japan .................................. 58-202658

[51] Int. Cl.$^4$ .................... G06F 11/04; G01R 31/28
[52] U.S. Cl. ............................ 364/490; 324/73 PC; 364/488
[58] Field of Search ............... 364/488–490, 364/550, 551; 324/73 R, 73 AT, 73 PC

[56] References Cited

U.S. PATENT DOCUMENTS

| | | | |
|---|---|---|---|
| 4,070,565 | 1/1978 | Borrelli | 364/490 X |
| 4,488,354 | 12/1984 | Chan et al. | 364/490 X |
| 4,493,045 | 1/1985 | Hughes, Jr. | 364/490 X |
| 4,517,661 | 5/1985 | Graf et al. | 364/490 X |

FOREIGN PATENT DOCUMENTS 2631483  1/1978  Fed. Rep. of Germany .

OTHER PUBLICATIONS

Patent Abstracts of Japan, vol. 7, No. 72, Mar. 25th, 1983.

A paper of the 12th "Reliability" Symposium; Nishimura et al., 1982, Method for Testing a Wafer Including Various LSI Chips.

*Primary Examiner*—Felix D. Gruber
*Assistant Examiner*—H. R. Herndon
*Attorney, Agent, or Firm*—Finnegan, Henderson, Farabow, Garrett & Dunner

[57] ABSTRACT

An IC device wherein a source of IC device type-distinguishing data is provided on an IC chip, and a section for drawing out the IC device type-distinguishing data is connected to said source of IC device type-distinguishing data formed on said IC chip.

9 Claims, 9 Drawing Figures

IC DEVICE AND A SYSTEM FOR TESTING THE SAME

BACKGROUND OF THE INVENTION

This invention relates to an IC device and a system for testing the same, and more particularly to an IC device and a system for testing the same adapted for the manufacture of various types of IC devices.

In the past, referring to FIG. 1, various types of IC devices have been tested by selecting a test program from among the program storing media, such as a paper tape 1, magnetic tape 2, floppy disc 3 or disc 4, and by loading the required test program in a testing system 5. Referring to FIG. 1 denoting the conventional IC device tester, reference numeral 6 shows a tester; reference numeral 7 denotes a tester control terminal unit; and reference numeral 8 indicates a tested device.

However, the above-mentioned conventional IC device tester has the drawbacks that the operater must accurately distinguish the type of tested IC device, find a test program corresponding to the type of tested IC device, and load the program in a tester. Therefore, a great deal of work and time is consumed each time the type of IC device is changed. If a different type of IC device is mixed with the tested IC devices, then the different type of IC device is judged as being disqualified. Therefore, it is necessary to classify tested IC devices by type in advance. When many types of IC devices are manufactured in a small number, the testing operation is accompanied with complexities and is often carried out inefficiently. Further, as the custom manufacture of IC devices has progressed, the tendency has been toward manufacturing many types of IC devices in a small number. As a result, many types of IC devices are manufactured. As it is necessary to manufacture IC devices without classifying them into types, the conventional IC device-testing technique is inadequate and fails to cope with the above-mentioned custom-made IC devices.

SUMMARY OF THE INVENTION

It is accordingly an object of this invention to provide a new and improved IC device which can be tested without being classified as to its type and without an operator's loading a test program prepared for testing the type of the device. The device of this invention therefore serves to improve the testing efficiency.

Another object of the invention is to provide a system for testing an IC device which has the same merits as described above.

According to the present invention, a source of data for distinguishing between the types of IC devices is stored on an IC chip. A section for drawing out the IC device type-distinguishing data is coupled to the source of the data.

BRIEF DESCRIPTION OF THE DRAWINGS

The present invention will be better understood by reference to the accompanying drawings, in which.

DETAILED DESCRIPTION OF THE PREFERRED EMBODIMENT

Figure 1:
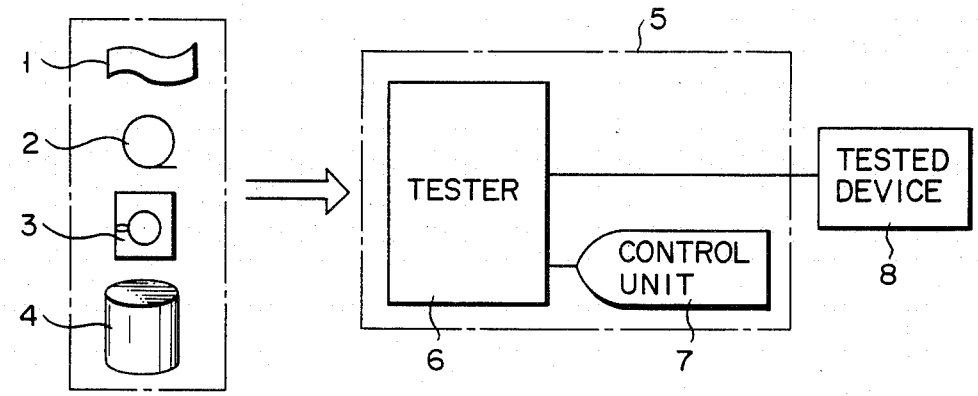
FIG. 1 schematically shows the arrangement of the conventional IC device-testing system.
Figure 2:
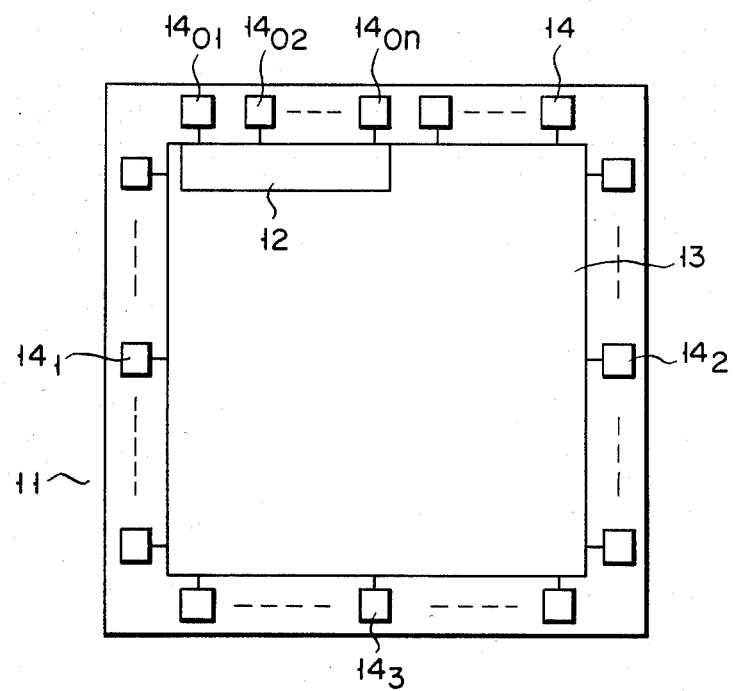
FIG. 2 is a plan view of an IC chip or an IC device embodying this invention.
Figure 3:
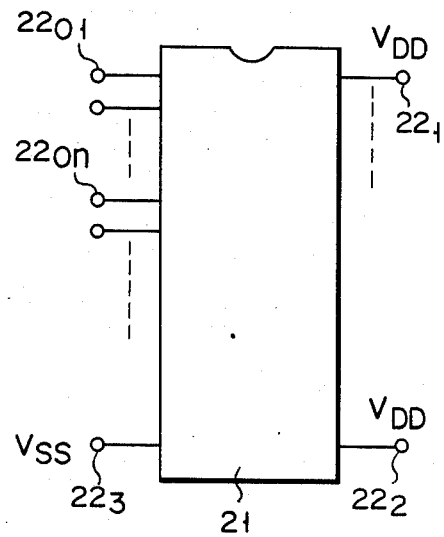
FIG. 3 is a plan view of an IC body obtained by packaging the IC chip of FIG. 2.

A description may now be made with reference to the accompanying drawings of the IC device-testing system. FIG. 2 represents an IC chip 11 involving a source 12 (ROM consisting of a plurality of bits) of data for distinguishing between the types of IC devices to be tested. Reference numeral 13 denotes the main interior circuit of the IC device. Reference numeral 14 shows a pad. Reference numerals $14_1$, $14_2$ are pads for a power source $V_{DD}$. Reference numeral $14_3$ is a pad for a power source $V_{SS}$. Reference numerals $14_{01}$ to $14_{0n}$ are pads (corresponding to the above-mentioned source 12 of the IC device type-distinguishing data) for drawing out IC device type-distinguishing data. FIG. 3 indicates an IC device prepared from the chip of FIG. 2. Reference numeral 21 denotes the IC device body. Reference numerals $22_1$ to $22_3$ show the pins which correspond to the aforementioned pads $14_1$ to $14_3$ and are connected to external elements. Reference numerals $22_{01}$ to $22_{0n}$ denote the pins which correspond to the aforesaid pads $14_{01}$ to $14_{0n}$ and are connected to external elements.

Figure 4:
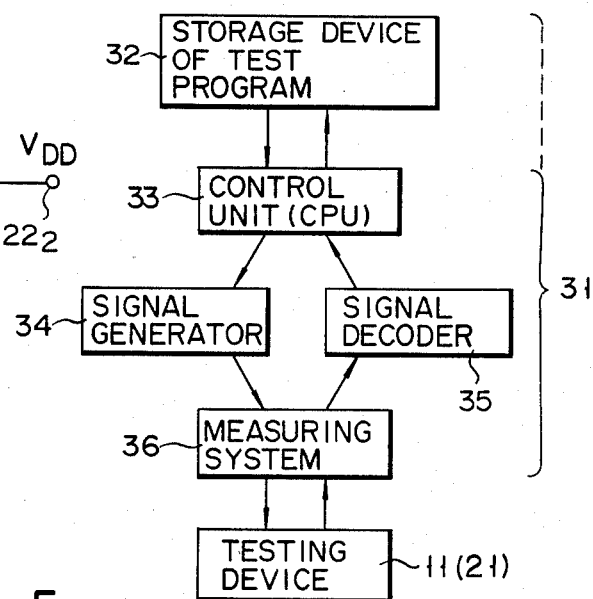
FIG. 4 schematically indicates the system of this invention for testing an IC device manufactured from the IC chip of FIG. 2 or the IC body of FIG. 3.
Figure 5:
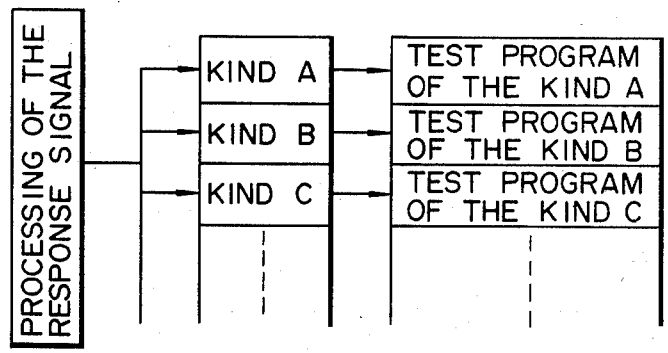
FIG. 5 sets forth the specified form of a test program used with the testing system of FIG. 4.

The IC device-testing system of this invention is characterized as follows. A memory section consisting of some bits, for example, ROM 12, is provided in an IC chip 11 or IC device body 21 as a source of data for distinguishing between the types of IC devices. When a wafer is tested, signal-reading pads $14_{01}$ to $14_{0n}$ and power supply pads $14_1$ to $14_3$ are provided in the prescribed positions on the surface of the wafer. When an IC device is tested, signal-reading pads $14_{01}$ to $14_{0n}$ and the corresponding pins $22_1$ to $22_3$ are set at prescribed positions on the surface of the IC device. According to the wafer or IC device tested, the tester 31 issues a specific signal as shown in FIG. 4 to the IC chip 11 or IC device 21. Data for distinguishing between the types of IC devices is read from ROM 12 provided in the IC chip 11 or IC device 21. Thereafter, as shown in FIG. 5, a test program corresponding to the type of IC device which is represented by the data thus read out is specified. When required, the specified test program is automatically loaded in the tester as shown in the flow chart of FIG. 6. Thus the test is started, and finally the tested IC device is classified by type.

FIG. 4 concretely shows the arrangement of the above-mentioned IC device-testing system. Reference numeral 31 represents a tester. Reference numeral 32 denotes a memory device storing test programs (refer to FIG. 5) corresponding to the various types of IC devices. Reference numeral 33 shows a control section (for example, CPU) equipped with an internal memory unit. Reference numeral 34 is a signal generator. Reference numeral 35 is a signal decoder. Reference numeral 36 shows a system for measuring the performance of the IC chip 11 or IC device 21.

Figure 6:
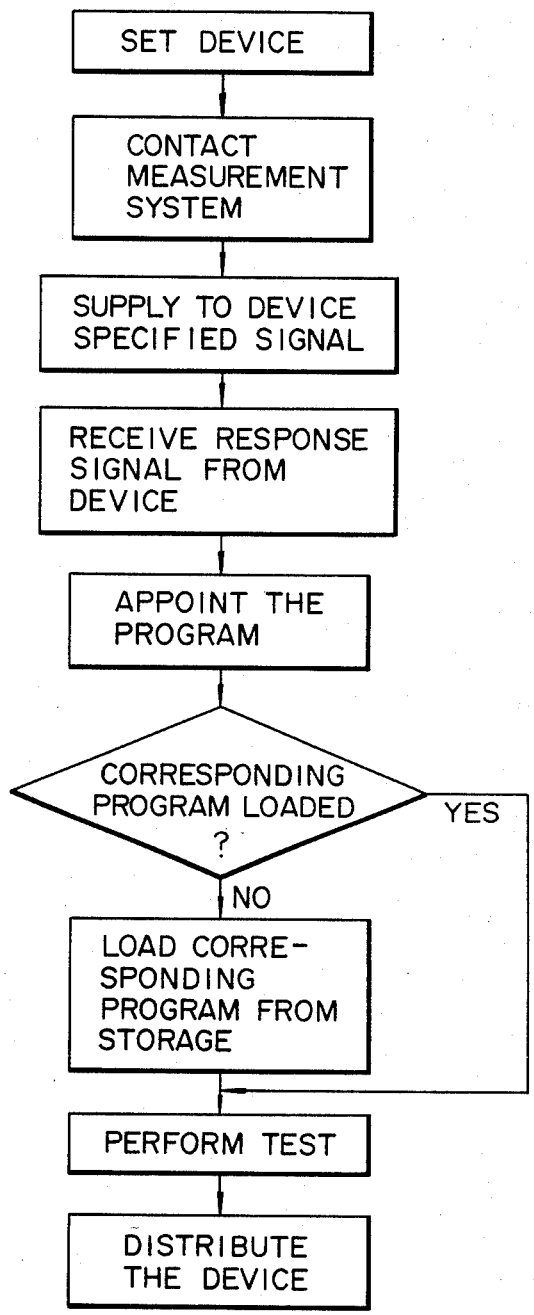
FIG. 6 is a flow chart showing the operation of the testing system of FIG. 4.

FIG. 6 indicates the sequential operation steps of the IC device-testing system of this invention. First, the IC chip 11 or IC device 21 is set in a prescribed position. Contact is established between the tested IC chip 11 or IC device 21 and the performance-measuring system 36. The control section 33 supplies power $V_{DD}$, $V_{SS}$ to the IC chip 11 and IC device 21 respectively through the signal generator 34 and performance-measuring system 36. The control section 33 further supplies the IC chip 11 or IC device 21 with an input signal to read out data for distinguishing between the types of IC devices. Upon receipt of a response from the tested device through the performance-measuring system 36 and signal decoder 35, the control section 33 recognizes the corresponding test program (see FIG. 5). Thereafter, the control section 33 determines whether or not a test program corresponding to the type of the current tested IC chip or device is stored in the internal memory unit. If it is found that this is not the case ("NO"), a test program corresponding to the current tested IC chip or device is loaded in the internal memory unit from the memory device 32. The subject IC chip or device is tested by means of the signal generator 34, performance-measuring system 36 and signal decoder 35. If, in this case, the internal memory unit of the control section 33 is already loaded with a test program, judgment is made to determine whether or not the loaded test program represents the type of IC chip or device which is being tested at present. If it is found that this is not the case ("NO"), a new test program corresponding to the currently tested IC chip or device is loaded in the internal memory unit of the control section 33 to test the subject IC chip or device. If it is judged that the previously loaded test program represents the type of the IC chip or device which is going to be tested, it is unnecessary to load the interval memory unit of the control section 33 with any new test program. Thus the subject IC chip or device is actually tested and classified by type.

Figure 7:
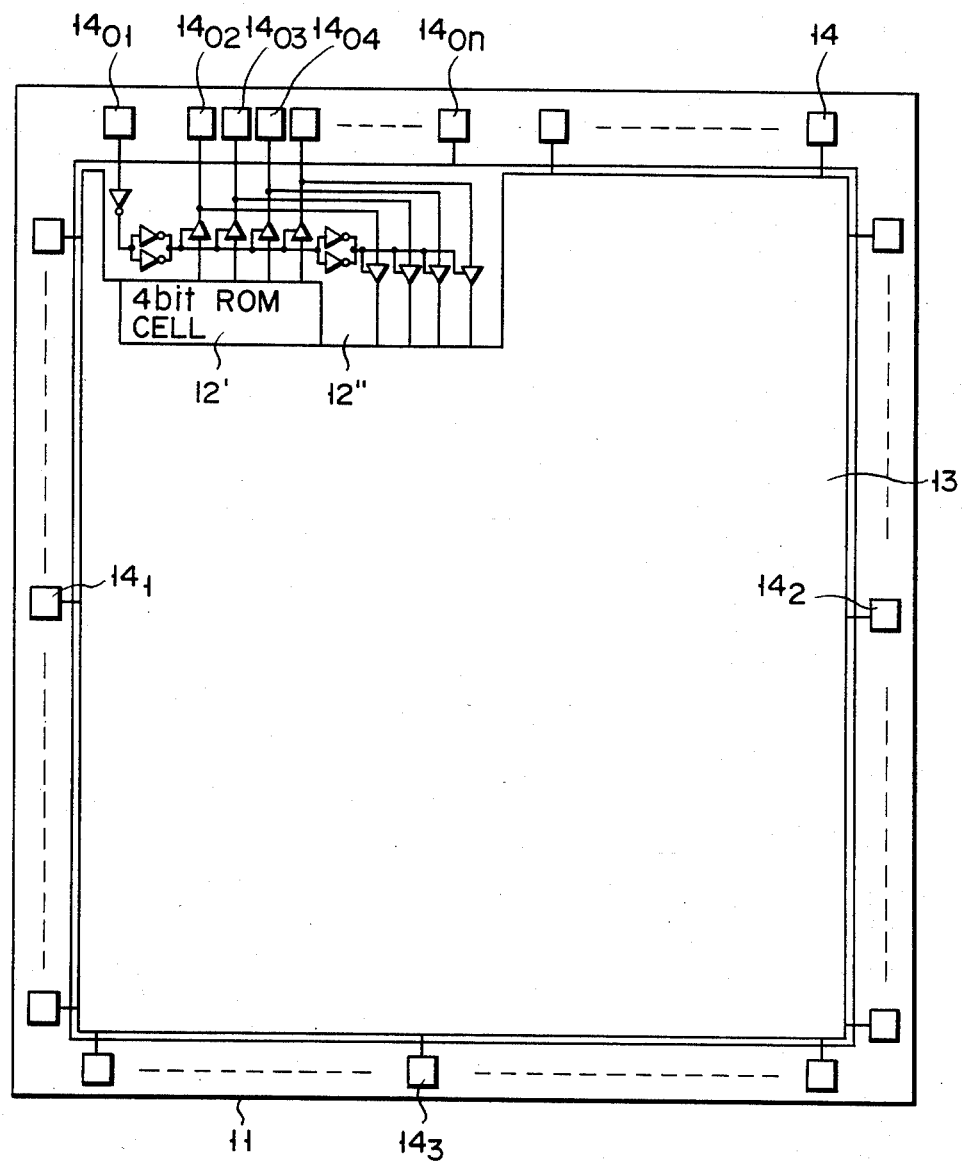
FIG. 7 is a concrete plan view of the IC chip of FIG. 2.
Figure 8:
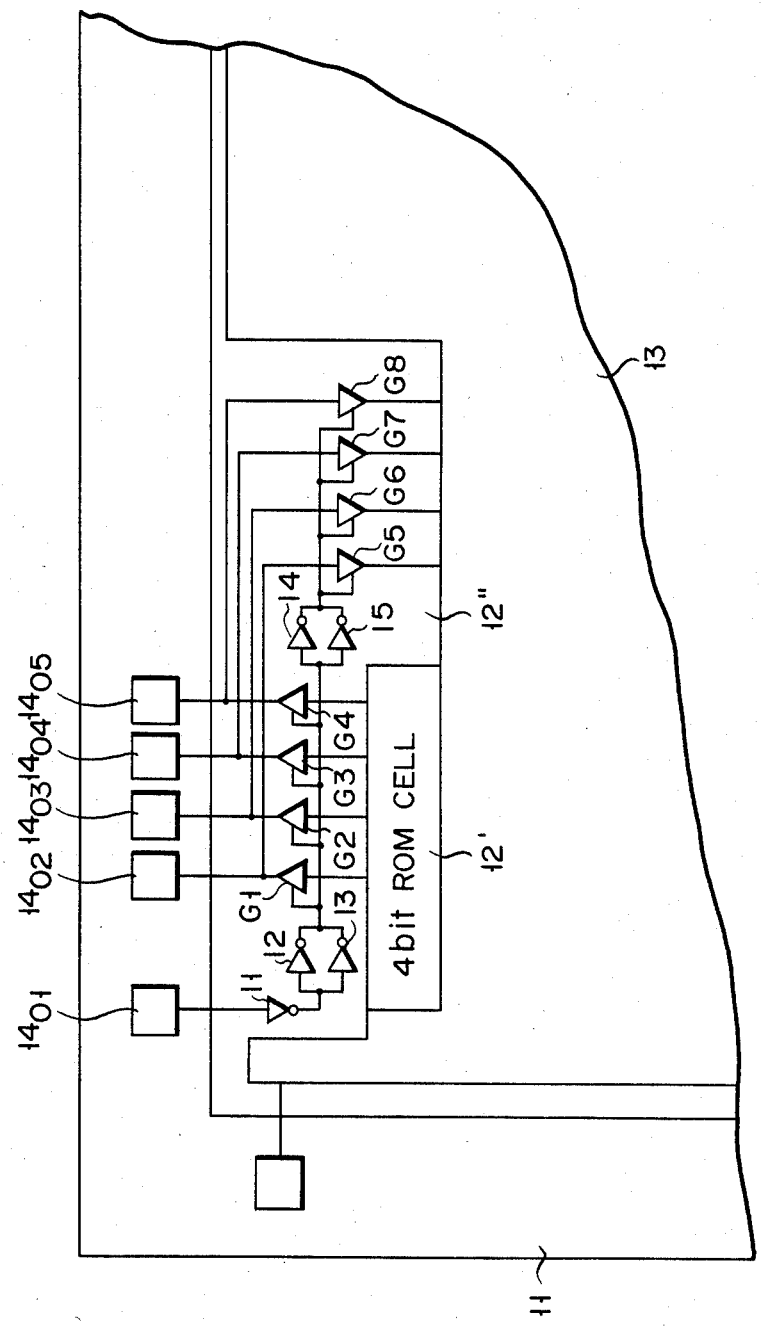
FIG. 8 is an enlarged view of the source (FIG. 7) of IC device type-distinguishing data.

FIG. 7 concretely shows the arrangement of the IC chip or device of FIG. 2 embodying this invention. FIG. 8 is an enlarged view of the data source 12 (ROM) of FIG. 7. The same parts of FIGS. 7 and 8 are denoted by the same numerals, a duplicate description thereof being omitted. Thus, reference numeral 12' represents a 4-bit ROM cell acting as a source of data for distinguishing between the types of IC chips or devices. When a specified signal having a high level (represented by a binary code "1") is supplied to the pad $14_{01}$ selected from among the pads $14_{01}$ to $14_{05}$ for drawing out the IC device type-distinguishing data, then the remaining pads $14_{02}$ to $14_{05}$ send forth IC device type-distinguishing data previously stored in the 4-bit ROM cell. When a specified signal having a low level (represented by binary code "0") is supplied to the selected pad $14_{01}$, then the remaining pads $14_{02}$ to $14_{05}$ can be used as the ordinary input or output pads. In other words, the IC chips or device embodying this invention is so arranged that the pads intended to draw out IC device type-distinguishing data can be concurrently applied as input pads. Therefore, except when it is intended to draw out IC device type-distinguishing data, the pad $14_{01}$ should be set at a low level (that is, at binary code "0").

The foregoing description was made on the assumption that a wafer would be tested. The test of an IC chip or device can be effected by letting the respective pads of FIG. 7 correspond to the data-drawing pins shown in FIG. 3.

Throughout FIGS. 7 and 8, reference numeral 12" represents an input mode-selecting circuit consisting of a group of inverters $I_1$ to $I_5$ and gate circuits $G_1$ to $G_8$. When, in FIG. 8, the pad $14_{01}$ is supplied with a high level signal (represented by binary code "1"), then the gate circuit $G_1$ to $G_4$ are so controlled as to cause the contents of the 4-bit ROM cell 12' to be read out through the inverters $I_1$ to $I_3$ to the pads $14_{02}$ to $14_{05}$. In this case, the gate circuits $G_5$ to $G_8$ are kept inoperative. When a low level signal (represented by binary code "0") is supplied to the pad $14_{03}$, then the gate circuits $G_5$ to $G_8$ are so controlled as to cause the input data from the pads $14_{02}$ to $14_{05}$ to be drawn into the IC circuits. At this time, the gate circuits $G_1$ to $G_4$ remain deactivated, unlike the aforementioned case.

Figure 9:
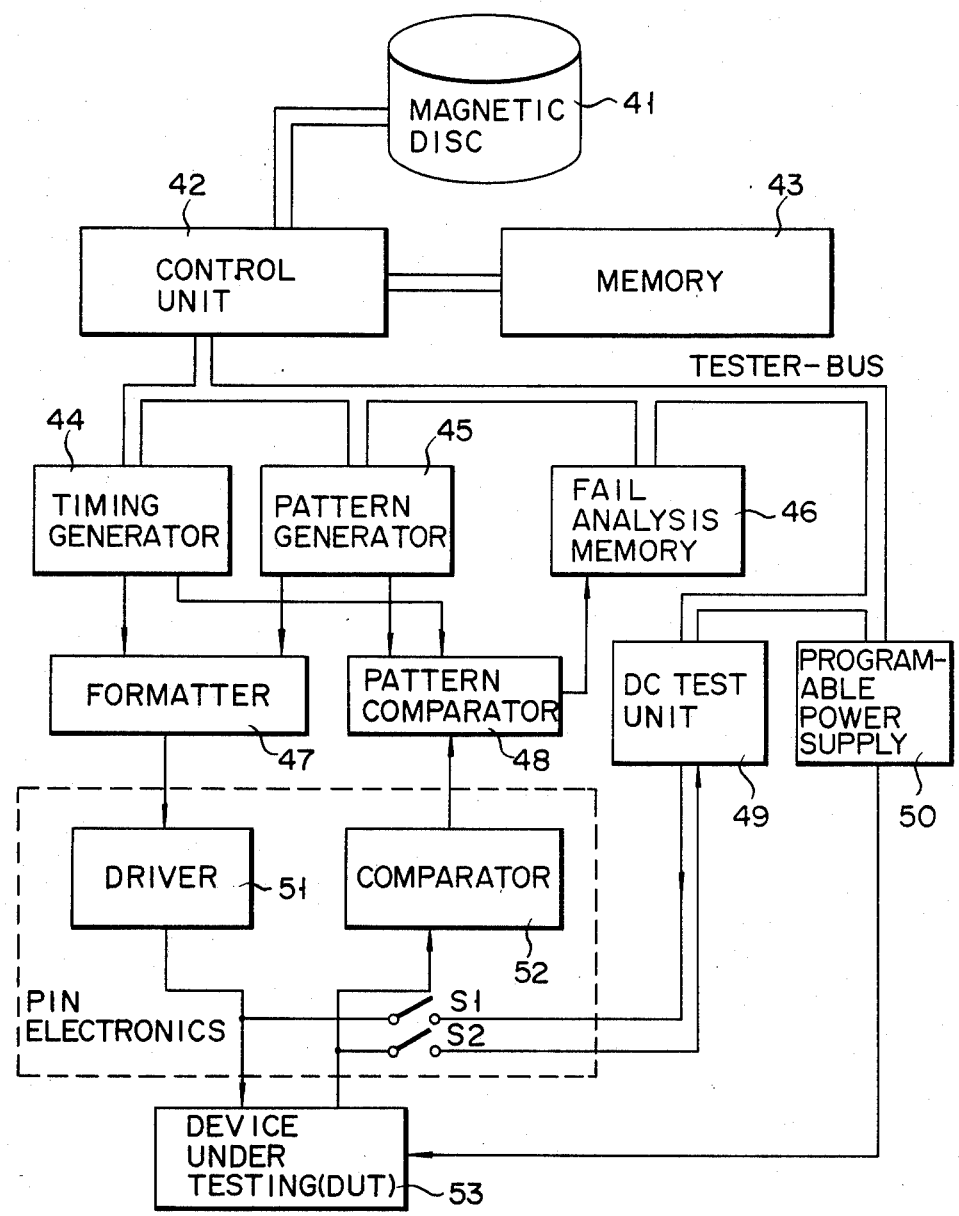
FIG. 9 concretely illustrates the arrangement of the IC device-testing system of FIG. 4.

FIG. 9 concretely shows the arrangement of the IC device-testing system of this invention. Reference numeral 41 represents a magnetic disc corresponding to a memory device 32 storing test programs corresponding to the various types of IC devices. Reference numeral 42 shows a control unit corresponding to the previously described control section 33. This control unit 42 is connected to the magnetic disc 41 and memory 43. The control section 33 is connected to a timing signal generator 44 and pattern generator 45. The timing signal generator 44 and pattern generator 45 are connected to a formatter 47 and pattern comparator 48. An output signal from the formatter 47 is delivered to a device under testing (DUT) 53 through a driver 51. When the DC characteristic of the DUT, for example, is tested, a DC test unit 49 connected to the tester bus is connected to the DUT 53, if necessary, through relay switches S1 and S2. At this time, a programmable power supply 50 is connected to the DUT 53. When the function and the AC characteristic of the DUT are tested, output response signals from the DUT 53 are supplied to the pattern comparator 48 through the comparator 52. Output signals from the pattern comparators which denote the result of the comparison of the patterns are sent forth to a fail analysis memory 46 connected to the tester bus. When the DC characteristic of an IC device is tested, output or input signals from the DUT 53 are supplied to the DC test unit 49, if necessary, through relay switches S1 and S2 to be compared with test limit values. Output signals from the fail analysis memory 46 and DC test unit 49 are used to classify the type of tested IC device by means of the control section 42 and memory 43. The driver 11 and comparator 12 together with the relay switches S1, S2 constitute the so-called pin electronics unit on a printed circuit board.

As described above, the IC device-testing system of this invention is advantageous in that the test program allotted to the IC device to be tested is automatically selected from those stored in the memory device and is automatically loaded in. Hence, the manual work which might otherwise be required to test an IC device of another type is dispensed with. The types of IC devices need not be classified for testing during manufacture. It suffices to classify the types in the final test stage. IC devices can be tested by a simple and efficient process, and in view of the growing tendency toward the custom manufacture of IC devices, the invention provides a useful technique of testing IC devices which tend to be manufactured in large varieties, but in only a small number.

What is claimed is:

1. An IC device comprising:
   an IC chip body;
   a main circuit formed on said IC chip body;
   type-distinguishing data output circuit, formed on said IC chip body, for outputting IC device type-distinguishing data associated with the type of said main circuit;
   first terminal means formed on a perdetermined first position on the periphery of said IC chip body and coupled to said main circuit; and
   second terminal means formed on a predetermined second positon on the periphery of said IC ship body and coupled to said type-distinguishing data output circuit.

2. The IC device according to claim 1, wherein said type-distinguishing data output circuit is a ROM having a plurality of bits.

3. The IC device according to claim 1, wherein each of said first and second terminal means includes a plurality of pads.

4. The IC device according to claim 1, further comprising:
   a package for accommodating said IC chip body, said main circuit, said type-distinguishing data output circuit and said first and second terminal means; and
   a first plurality of pins each having one end coupled to said first terminal means in said package and the other end projecting out of said package; and
   a second plurality of pins each having one end coupled to said second terminal means in said package and the other end projecting out of said package.

5. The IC device according to claim 1, further comprising:
   first gate means coupled between said main circuit and said first terminal means;
   second gate means coupled between said type-distinguishing data output circuit and said first terminal means; and
   selecting means, coupled between said second terminal means and both of said first and second gate means, for selectively activating said second terminal means and said type-distinguishing data output circuit, or said first terminal means and said main circuit, so that part of said first terminal means is used as said second terminal means at times when data is input to said main circuit.

6. A system for testing an IC device comprising:
   a testing IC device including a main circuit to be tested, a type-distinguishing data output circuit for outputting IC device type-distinguishing data associated with the type of said main circuit, and a plurality of terminal means selectively coupled to said main circuit and said type-distinguishing data output circuit with a given positional relationship;
   IC device type-distinguishing means for producing a signal to read said IC device type-distinguishing data from said type-distinguishing data output circuit of said testing IC device via said plurality of terminal means, and for receiving said IC device type-distinguishing data and determining to which type of IC device as IC device type-distinguishing data belongs;
   test program-reading means for receiving the determination results from said IC device-type distinguishing means and for selecting a test program corresponding to the determination results from a plurality of prestored test programs; and
   testing means for executing a predetermined test on said testing IC device according to said test program selected by said test program-reading means.

7. The IC device-testing system according to claim 6, further comprising a primary memory section and a secondary memory section wherein said test program-reading means causes at least one test program previously stored in said primary memory section to be transferred to said secondary memory section.

8. The IC device-testing system according to claim 7, wherein said test program-reading means has a test program-loading function, which, when a test program corresponding to the result of the determination of the IC device corresponding to the result of the determination of the IC device type-distinguishing data is not previously transferred to said secondary memory section, causes the test program to be read from said primary memory section.

9. The IC device-testing system according to claim 7, wherein said test program-reading means has a test program-unloading function, which, when a test program corresponsing to the result of the determination of the IC device type-distinguishing data is already transferred to said secondary memory section, prevents the test program to be read from said primary memory section.

* * * * *